(12) United States Patent
Ishikawa et al.

(10) Patent No.: US 7,362,782 B2
(45) Date of Patent: Apr. 22, 2008

(54) OPTICAL SEMICONDUCTOR DEVICE AND CONTROLLING METHOD OF THE SAME

(75) Inventors: Tsutomu Ishikawa, Yamanashi (JP); Takuya Fujii, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 0 days.

(21) Appl. No.: 11/727,953

(22) Filed: Mar. 29, 2007

(65) Prior Publication Data

US 2007/0230521 A1 Oct. 4, 2007

(30) Foreign Application Priority Data

Mar. 31, 2006 (JP) ............................. 2006-097707

(51) Int. Cl.
*H01S 3/10* (2006.01)
*H01S 3/13* (2006.01)
*H01S 3/00* (2006.01)

(52) U.S. Cl. .................. 372/20; 372/29.02; 372/34

(58) Field of Classification Search .................. 372/20, 372/29.02, 34, 36; 398/182
See application file for complete search history.

(56) References Cited

U.S. PATENT DOCUMENTS

| | | | |
|---|---|---|---|
| 5,536,085 A * | 7/1996 | Li et al. | 372/50.12 |
| 6,757,499 B1 * | 6/2004 | Aoki | 398/182 |
| 7,079,715 B2 * | 7/2006 | Kish, Jr. et al. | 385/14 |
| 7,224,708 B2 * | 5/2007 | Sin et al. | 372/34 |
| 2001/0024462 A1 * | 9/2001 | Nakahara et al. | 372/43 |
| 2002/0090011 A1 * | 7/2002 | Pezeshki et al. | 372/20 |
| 2003/0006225 A1 * | 1/2003 | Choa | 219/210 |
| 2006/0203862 A1 * | 9/2006 | Bonen et al. | 372/34 |

FOREIGN PATENT DOCUMENTS

JP 11-186645 7/1999

* cited by examiner

*Primary Examiner*—Minsun Oh Harvey
*Assistant Examiner*—Phillip Nguyen
(74) *Attorney, Agent, or Firm*—Kratz, Quintos & Hanson, LLP

(57) ABSTRACT

An optical semiconductor device includes a wavelength-tunable semiconductor laser chip, a mount carrier, a first temperature sensor and a wire. The wavelength-tunable semiconductor laser chip has a first optical waveguide and a second optical waveguide. The second optical waveguide has a heater on a surface thereof and is optically coupled to the first optical waveguide. The mount carrier is for mounting the wavelength-tunable semiconductor laser chip, and has a first area arranged at a surface of the mount carrier of the first optical waveguide side when the wavelength-tunable semiconductor laser chip is mounted. The first temperature sensor is mounted on the first area. The wire couples between the heater and a second area arranged at a surface of the mount carrier of the second optical waveguide side when the wavelength-tunable semiconductor laser chip is mounted.

8 Claims, 5 Drawing Sheets

OPTICAL SEMICONDUCTOR DEVICE AND CONTROLLING METHOD OF THE SAME

BACKGROUND OF THE INVENTION

1. Field of the Invention

This invention generally relates to an optical semiconductor device and a controlling method of the optical semiconductor device.

2. Description of the Related Art

Generally, a wavelength-tunable semiconductor laser has a structure in which a laser diode and a thermistor are mounted on a mount carrier and the mount carrier is mounted on a temperature control device (TEC). The wavelength-tunable semiconductor laser has a gain for a laser emission and can select a wavelength of the laser. There are some methods of selecting a wavelength. For example, the methods include a method of changing a resonant wavelength of loss or gain by changing a refractive index or angle of a diffractive grating or an etalon provided in a laser cavity. And the methods include a method of changing a resonant wavelength of the laser cavity by changing an optical length in the laser cavity (refractive index or a physical length of the laser cavity).

The method of changing the refractive index has an advantage in reliability or manufacturing cost, because a mechanical operating portion like the method of changing the angle or length is not necessary. The refractive index changing method includes changing a temperature of an optical waveguide, changing a carrier density in the optical waveguide by providing a current, and so on. A semiconductor laser having a Sampled Grating Distributed Reflector (SG-DR) is supposed as a wavelength tunable semiconductor laser that changes a temperature of an optical waveguide, where the SG-DR has a wavelength selection function.

In this semiconductor laser, if a reflection spectrum of a plurality of SG-DR regions (reflection region) is controlled preferably, a predetermined wavelength can be selected with a vernier effect. That is, this semiconductor laser emits a laser light at a wavelength where reflection peaks of two SG-DR regions are overlapped with each other. It is therefore possible to select the lasing wavelength by controlling each of the reflection peaks of the SG-DR regions.

Generally, a heater is provided on a surface of one of the SG-DR regions. It is possible to change the temperature of an optical waveguide of the SG-DR region where the heater is provided, with heat generated by the heater. As a result, a refractive index of the optical waveguide is changed. Accordingly, it is possible to select a reflection peak wavelength of the SG-DR region where the heater is provided, by controlling the heating value of the heater.

It is possible to control the lasing wavelength to be a desirable one by controlling the refractive index of the optical waveguide of the SG-DR segments, with use of a temperature control device providing heat to whole of a semiconductor laser. In this case, it is necessary to control the temperature of the semiconductor laser accurately. And so, Japanese Patent Application Publication No. 11-186645 (hereinafter referred to as Document 1) discloses a method of feedback control according to a detection result of a resistance of a thermistor arranged on a predetermined position of the temperature control device.

In Document 1, the thermistor is arranged near a semiconductor laser chip not having a heater. Therefore, the thermistor can detect a temperature accurately. However, in the conventional art mentioned above, the heater is provided on a surface of the SG-DR region. The thermistor arranged near the SG-DR region is subjected to heat from the heater and from a wire connected to the heater, when heating value of the heater is large. In this case, there is generated a temperature detection error in the thermistor. It is therefore difficult to control the lasing wavelength of the semiconductor laser accurately.

SUMMARY OF THE INVENTION

The present invention provides an optical semiconductor device and a controlling method of the optical semiconductor device that can control a lasing wavelength accurately.

According to an aspect of the present invention, preferably, there is provided an optical semiconductor device including a wavelength-tunable semiconductor laser chip, a mount carrier, a first temperature sensor and a wire. The wavelength-tunable semiconductor laser chip has a first optical waveguide and a second optical waveguide. The second optical waveguide has a heater on a surface thereof and is optically coupled to the first optical waveguide. The mount carrier is for mounting the wavelength-tunable semiconductor laser chip, and has a first area arranged at a surface of the mount carrier of the first optical waveguide side when the wavelength-tunable semiconductor laser chip is mounted. The first temperature sensor is mounted on the first area. The wire couples between the heater and a second area arranged at a surface of the mount carrier of the second optical waveguide side when the wavelength-tunable semiconductor laser chip is mounted.

With the above-mentioned configuration, the wire coupled to the heater is not coupled to the first area where the first temperature sensor is provided. In this case, a distance between the first temperature sensor and the wire and a distance between the first temperature sensor and a connecting point of the wire are large. The first temperature sensor is thus less subjected to the heat from the heater. And the first temperature sensor can detect the temperature of the first optical waveguide accurately. It is therefore possible to control a lasing wavelength of the optical semiconductor device accurately by controlling the temperature of the first optical waveguide according to the detection result of the first temperature sensor.

According to another aspect of the present invention, preferably, there is provided a controlling method of an optical semiconductor device including controlling a lasing wavelength of a wavelength-tunable semiconductor laser chip, by controlling a temperature of a temperature control device according to a detection result of a first temperature sensor. The optical semiconductor device has the wavelength-tunable semiconductor laser chip, a mount carrier for mounting the wavelength-tunable semiconductor laser chip, the first temperature sensor and a wire. The wavelength-tunable semiconductor laser chip has a first optical waveguide and a second optical waveguide. The second optical waveguide has the heater on a surface thereof and is optically coupled to the first optical waveguide. The mount carrier has a first area arranged at a surface of the mount carrier of the first optical waveguide side when the wavelength-tunable semiconductor laser chip is mounted. The mount carrier is mounted on the temperature control device. The first temperature sensor is mounted on the first area. The wire couples between the heater and a second area arranged at a surface of the mount carrier of the first optical waveguide side when the wavelength-tunable semiconductor laser chip is mounted.

With the above-mentioned configuration, the refractive index of the second optical waveguide is changed when the heater changes the temperature of the second optical waveguide. And the local reflection peak wavelength of the second optical waveguide is changed. On the other hand, the refractive index of the first optical waveguide is changed when the temperature control device changes the temperature of the first optical waveguide according to the detection result of the first temperature sensor. And the local reflection peak wavelength of the first optical waveguide is changed. It is therefore possible to control the lasing wavelength of the wavelength-tunable semiconductor laser chip. Here, the wire coupled to the heater is not coupled to the first area where the first temperature sensor is provided. In this case, a distance between the first temperature sensor and a connecting point of the wire are large. The first temperature sensor is thus less subjected to the heat from the heater. And the first temperature sensor can detect the temperature of the first optical waveguide accurately. It is therefore possible to control a lasing wavelength of the optical semiconductor device accurately.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1A:
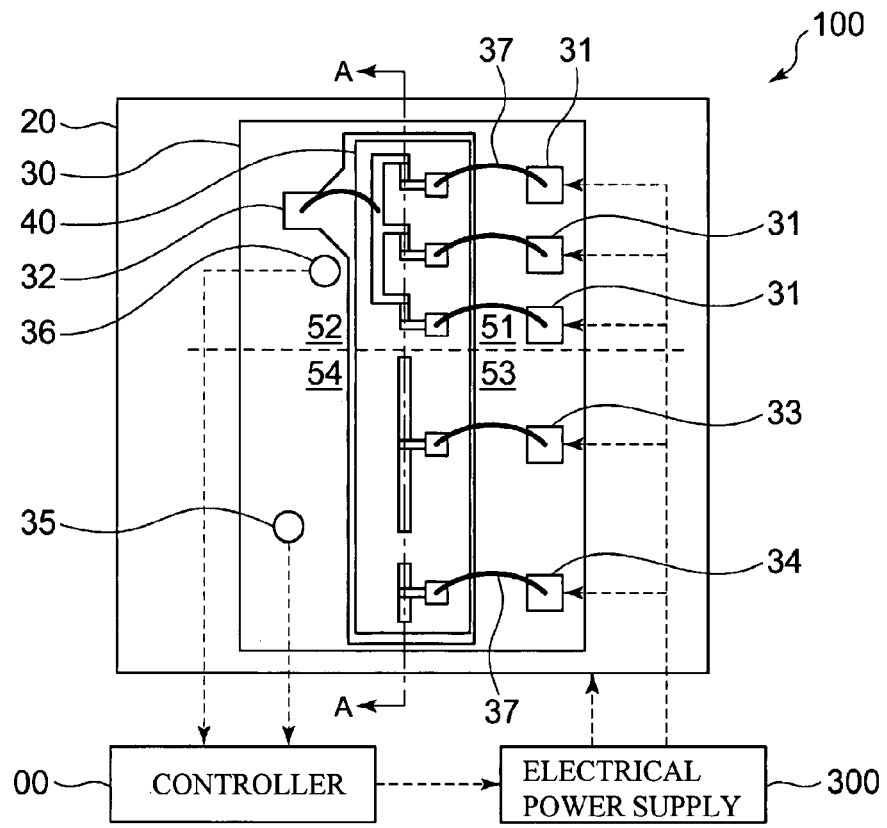
FIG. 1A and FIG. 1B illustrate a laser module in accordance with a first embodiment of the present invention.
Figure 1B:
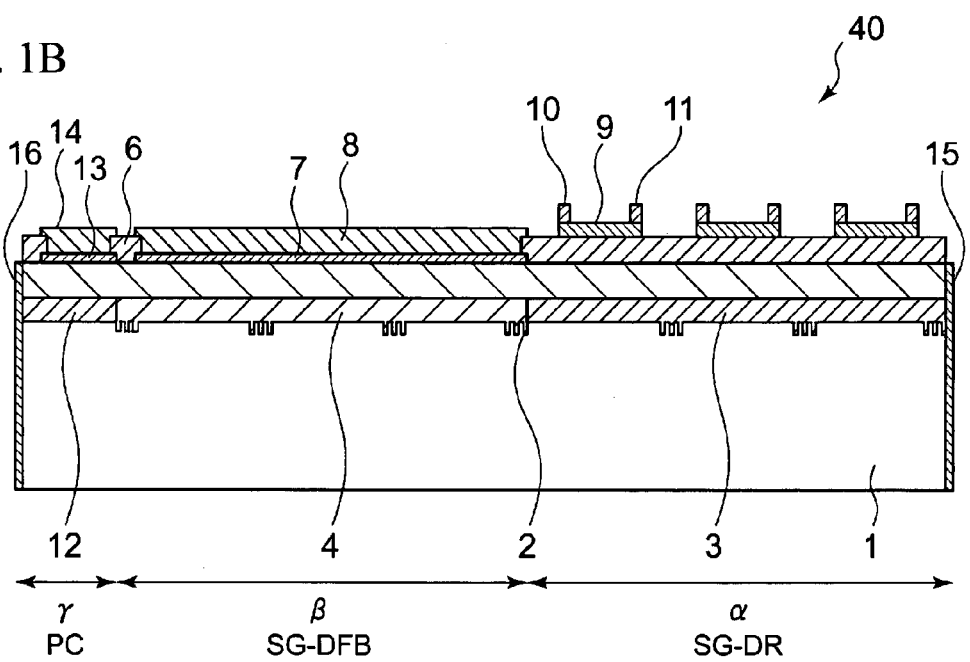

FIG. 1A and FIG. 1B illustrate a laser module 100 in accordance with a first embodiment of the present invention. FIG. 1A illustrates a top view of the laser module 100. FIG. 1B illustrates a cross sectional view taken along a line A-A of FIG. 1A. As shown in FIG. 1A, the laser module 100 has a temperature control device 20, a mount carrier 30 and a wavelength-tunable semiconductor laser chip 40. A controller 200 and an electrical power supply 300 are provided out of the laser module 100. The controller 200 controls an operation of the laser module 100. The electrical power supply provides an electrical power to the laser module 100. The controller 200 has a central processing unit (CPU), a read only memory (ROM), a random access memory (RAM) and so on. The laser module 100, the controller 200 and the electrical power supply 300 are collectively referred to as a laser device.

The temperature control device 20 controls the temperature of the wavelength-tunable semiconductor laser chip 40. The temperature control device 20 is coupled to the electrical power supply 300. The temperature control device 20 controls the temperature of the wavelength-tunable semiconductor laser chip 40 by changing the temperature thereof according to an electrical power provided from the electrical power supply 300.

As shown in FIG. 1B, the wavelength-tunable semiconductor laser chip 40 has a structure in which a Sampled Grating Distributed Reflector (SG-DR) region α, a Sampled Grating Distributed Feedback (SG-DFB) region β and a Power Control (PC) region γ are coupled in order.

The SG-DR region α has a structure in which an optical waveguide layer 3, a cladding layer 5 and an insulating layer 6 are laminated on a substrate 1 in order and a heater 9, a power electrode 10 and a ground electrode 11 are laminated on the insulating layer 6. The SG-DFB region β has a structure in which an optical waveguide layer 4, the cladding layer 5, a contact layer 7 and an electrode 8 are laminated on the substrate 1 in order. The PC region γ has a structure in which an optical waveguide layer 12, the cladding layer 5, a contact layer 13 and an electrode 14 are laminated on the substrate 1 in order. The substrate 1 and the cladding layer 5 of the SG-DR region α, the SG-DFB region β and the PC region γ are a single layer formed as a unit respectively. The optical waveguide layers 3, 4 and 12 are formed on a same plane and are optically coupled to each other.

A low reflecting coating 15 is formed on end facet of the substrate 1, the optical waveguide layer 3 and the cladding layer 5 at the SG-DR region α side. On the other hand, a low reflecting coating 16 is formed on end facet of the substrate 1, the optical waveguide layer 12 and the cladding layer 5 at the PC region γ side. Diffractive gratings 2 are formed at a given interval in the optical waveguide layers 3 and 4. The sampled grating is thus formed. The insulating layer 6 is further formed between the electrode 8 and the electrode 14.

The substrate 1 is, for example, a semiconductor substrate composed of InP. The optical waveguide layer 3 is, for example, composed of InGaAsP crystal having an absorption edge wavelength at shorter wavelengths side compared to the laser lasing wavelength. PL wavelength of the optical waveguide layer 3 is approximately 1.3 μm. The optical waveguide layer 4 is, for example, an active layer composed of InGaAsP crystal amplifying a light of a desirable wavelength of a laser emission. The PL wavelength of the optical waveguide layer 4 is approximately 1.57 μm. The optical waveguide layer 12 is, for example, composed of InGaAsP crystal for changing the output of the emitted light by absorbing or amplifying a light. The PL wavelength of the optical waveguide layer 12 is approximately 1.57 μm.

SG-DR segments are formed in the optical waveguide layer 3. Other SG-DR segments are formed in the optical waveguide layer 4. Three SG-DR segments are formed in the optical waveguide layer 3 and in the optical waveguide layer 4 respectively, in the embodiment. Here, the SG-DR segment is a region in which one region having the diffractive grating 2 and one space region not having the diffractive grating 2 are combined in the optical waveguide layers 3 and 4.

The cladding layer 5 is composed of InP and confines a laser light traveling in the optical waveguide layers 3, 4 and 12. The contact layers 7 and 13 are composed of InGaAsP crystal. The insulating layer 6 is a passivation film composed of an insulator such as SiN. The low reflecting coatings 15 and 16 are, for example, composed of a dielectric film including $MgF_2$ and TiON. The reflectivity of the low reflecting coatings 15 and 16 are, for example, less than 0.3%.

The heater 9 is composed of such as NiCr. Each heater 9 is formed on the insulating layer 6 above each SG-DR segment respectively. The power electrode 10 and the ground electrode 11 are coupled to the heater 9. The power electrode 10, the ground electrode 11, the electrode 8 and the electrode 14 are composed of a conductive material such as Au.

The mount carrier 30 is composed of an insulating material such as AlN and has a substantially rectangular parallelepiped shape. The mount carrier 30 is mounted on the temperature control device 20. The wavelength-tunable semiconductor laser chip 40 is mounted on the mount carrier 30. In the embodiment, the wavelength-tunable semiconductor laser chip 40 is mounted on the mount carrier 30 so that the optical waveguide layers 3, 4 and 12 are parallel to a side of the mount carrier 30. There are provided metal patterns 31, a metal pattern 32, a metal pattern 33, a metal pattern 34 and temperature sensors 35 and 36 on the mount carrier 30. Each of the metal patterns 31 is used for providing electrical power to the heater 9. The metal pattern 32 is used for grounding the heater 9. The metal pattern 33 is used for providing electrical power to the electrode 8. The metal pattern 34 is used for providing electrical power to the electrode 14. The metal patterns 31 through 34 are composed of a conductive material such as Au.

Each metal pattern 31 is coupled to each power electrode 10 through a wire 37. The metal pattern 32 is coupled to the ground electrode 11 through another wire 37. And the metal pattern 32 is coupled to the substrate 1 of the wavelength-tunable semiconductor laser chip 40. The metal pattern 32 thus acts as a ground electrode of a pathway (SG-DFB region β) where a current flows to the optical waveguide layer 4 from the electrode 8 and a pathway (PC region γ) where a current flows to the optical waveguide layer 12 from the electrode 14. The metal pattern 32 may extend across whole of the bottom of the wavelength-tunable semiconductor laser chip 40. The metal pattern 33 is coupled to the electrode 8 through another wire 37. The metal pattern 34 is coupled to the electrode 14 through another wire 37. The wire 37 is composed of a conductive material having a high electrical conductivity. The wire 37 is composed of a metal such as Au and has a diameter of approximately 20 μm. The metal patterns 31, 33 and 34 are coupled to the electrical power supply 300 through a control terminal not shown. The metal pattern 32 is grounded through a control terminal not shown.

Here, an upper surface of the mount carrier 30 is supposed to be divided into four areas with two lines. One of the two lines is a centerline of the optical waveguide layer 3 in a length direction of the optical waveguide layer 3. The other is a line at right angles to the centerline and passes an end of the optical waveguide layer 3 at the optical waveguide layer 4 side. Two of the four areas at the optical waveguide layer 3 side are referred to as an area 51 and an area 52. An area at the optical waveguide layer 4 side and adjacent to the area 51 is referred to as an area 53. An area at the optical waveguide layer 4 side and adjacent to the area 52 is referred to as an area 54. That is, the area 51 and the area 54 are arranged diagonally to each other. And the area 52 and the area 53 are arranged diagonally to each other.

The metal pattern 31 is coupled to the wire 37 in the area 51. The metal pattern 32 is coupled to the wire 37 in the area 52. It is the same even if the metal pattern 32 extends across the whole bottom of the wavelength-tunable semiconductor laser chip 40. The metal patterns 33 and 34 are coupled to the wire 37 in the area 53. The temperature sensor 35 is arranged on the area 54. The temperature sensor 36 is arranged on the area 51 or on the area 52 around the SG-DR region α. The metal patterns 33 and 34 may be coupled to the wire 37 in any of the areas 51 through 54.

Next, a description will be given of an operation of the laser module 100. At first, the controller 200 controls the electrical power supply 300 so that a current is provided to the electrode 8 through the metal pattern 33 and the wire 37. And the controller 200 controls the electrical power supply 300 so that a current is provided to the electrode 14 through the metal pattern 34 and the wire 37. A light is generated in the optical waveguide layer 4 because the current is provided to the optical waveguide layer 4 through the electrode 8. The light propagates in the optical waveguide layers 3 and 4, is reflected and amplified repeatedly. Then, it causes lasing oscillation. A part of the laser light is amplified or absorbed in the optical waveguide layer 12 and is emitted through the low reflecting coating 16. It is possible to control the gain or the absorptance of the optical waveguide layer 12 with the current provided to the electrode 14. The controller 200 can keep the output of the emitted light of the wavelength-tunable semiconductor laser chip 40 constant by controlling the current to be provided to the electrode 14.

The controller 200 controls the electrical power supply 300 so that a current is provided to the heater 9 through the metal pattern 31 and the wire 37 and a current is provided to the temperature control device 20. The controller 200 can control the temperature of the optical waveguide layer 3 of the SG-DR region α according to the currents to be provided to the heater 9 and the temperature control device 20. The controller 200 may control the temperature of the optical waveguide layer 3 by mainly controlling the heater 9 with a feedback loop according to the detection result of the temperature sensor 36.

The refractive index of the optical waveguide layer 3 is changed when the temperature of the optical waveguide layer 3 is changed. And the reflection peak wavelength of the SG-DR region α is changed. Accordingly, a laser light is emitted at a wavelength where the reflection peak wavelength of the SG-DR region α and the reflection peak wavelength of the SG-DFB region β are overlapped to each other. That is, it is possible to select the lasing wavelength of the wavelength-tunable semiconductor laser chip 40.

The temperature of the mount carrier 30 in an area where the SG-DR region α is mounted is referred to as $T_{TEC1}$. The temperature $T_H$ of the optical waveguide layer 3 is shown as Expression 1. $\Delta T$ in Expression 1 is heating temperature caused by the heat from the heater 9.

$$T_H = T_{TEC1} + \Delta T \qquad \text{Expression 1}$$

The controller 200 can control both temperatures of the optical waveguide layer 3 and the optical waveguide layer 4 according to the current to be provided to the temperature control device 20. In this case, the controller 200 controls the temperature of the optical waveguide layers 3 and 4 by controlling the temperature control device 20 with a feedback loop according to the detection result of the temperature sensor 35. Both reflection wavelengths of the SG-DR region α and the SG-DFB region β are changed when the temperature of the optical waveguide layers 3 and 4 are changed. It is therefore possible to control the emission wavelength of the wavelength-tunable semiconductor laser chip 40 to be a desirable one. And it is possible to control the lasing wavelength of the wavelength-tunable semiconductor laser chip 40 to be the desirable one even if external temperature is changed.

The temperature of the mount carrier 30 in a area where the SG-DFB region β is mounted is referred to as temperature $T_{TEC2}$. The temperature $T_{LD}$ of the optical waveguide layer 4 is shown as Expression 2.

$$T_{LD} = T_{TEC2} \qquad \text{Expression 2}$$

Here, the heat generated in the heater 9 is conducted to the metal patterns 31 and 32 through the wire 37. That is, the areas 51 and 52 are heated by the heat from the heater 9. And The $T_{TEC1}$ is larger than the $T_{TEC2}$. In this case, it is apprehended that the temperature sensor 35 does not detect the temperature of the optical waveguide layer 4 accurately. However, the temperature sensor 35 is less subjected to the heat from the heater 9 because the temperature sensor 35 is arranged on the area 54. The controller 200 can control the temperature of the optical waveguide layer 4 with a feedback loop accurately. The laser module 100 can emit a laser light at a desirable wavelength.

An operator may control the laser module 100 manually, although the controller 200 controls the laser module 100 in the embodiment. The temperature sensor 35 may be arranged either on the area 53 or on the area 54. In the embodiment, it is preferable that the temperature sensor 35 is arranged on the area 54. The heat from the heater 9 is inclined to flow to the area 51 compared to the area 52, because one of the four wires 37 is coupled to the area 52 and three of the four wires 37 are coupled to the area 51, where the four wires 37 are coupled to the heater 9. As the temperature sensor 35 is arranged on the area 54 arranged diagonally to the area 51, a distance between the temperature sensor 35 and the area that is subjected to the heat from the heater 9 is large. And the temperature sensor 35 is less subjected to the heat from the heater 9.

The metal pattern 31 may extend to other area, as being case of the metal pattern 32, although the metal pattern 31 is arranged in the area 51 in the embodiment. The temperature sensor 36 may be arranged on the surface of the wavelength-tunable semiconductor laser chip 40 around the SG-DR region α, although the temperature sensor 36 is arranged on the mount carrier 30 in the embodiment. In this case, the temperature sensor 36 may be manufactured on the wavelength-tunable semiconductor laser chip 40 with a lithography method as mentioned in Document 1. The temperature sensor 36 may not be provided. The effect of the present invention is obtained even if the temperature sensor 36 is not provided.

In the embodiment, the optical waveguide layer 4 corresponds to the first optical waveguide. The optical waveguide layer 3 corresponds to the second optical waveguide. The area 54 corresponds to the first area. The temperature sensor 35 corresponds to the first temperature sensor.

Second Embodiment

Figure 2:
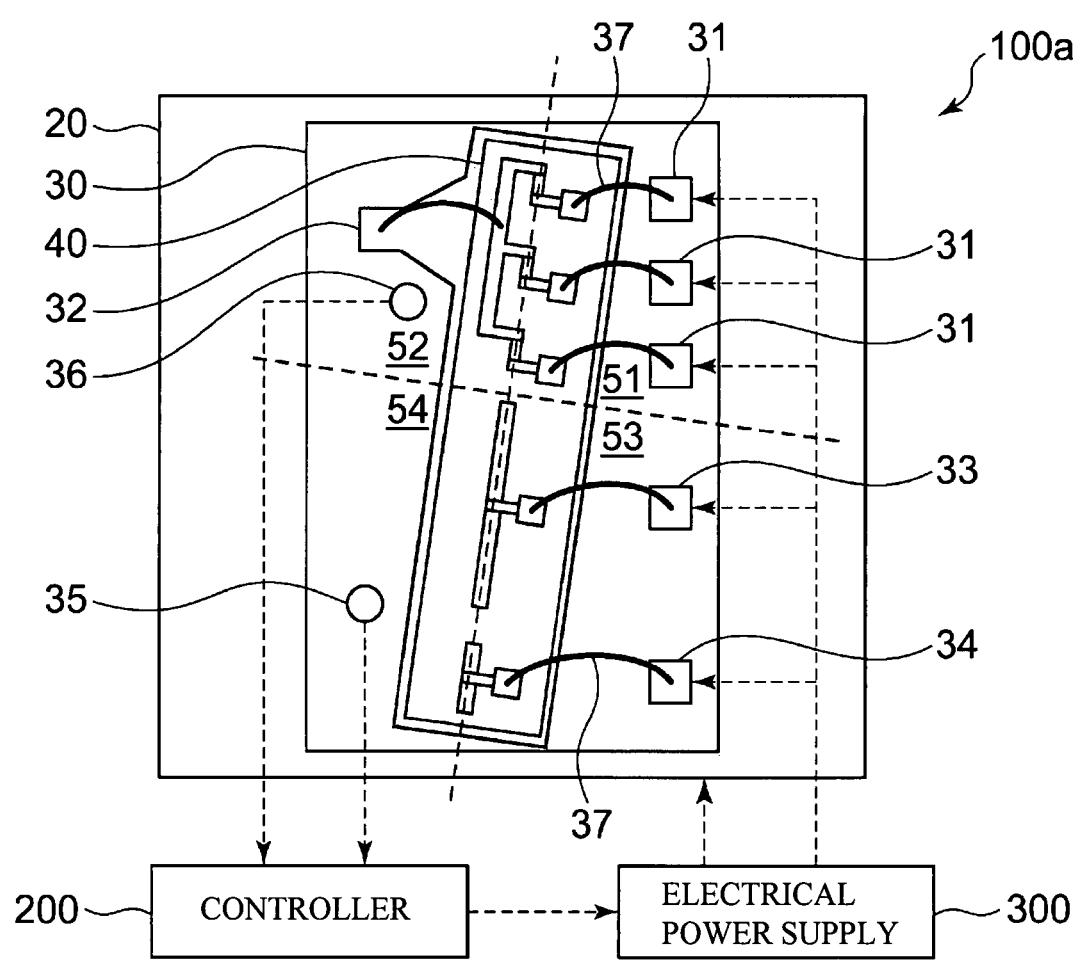
FIG. 2 illustrates an overall structure of a laser module in accordance with a second embodiment.

Next, a description will be given of a laser module 100a in accordance with a second embodiment of the present invention. FIG. 2 illustrates an overall structure of the laser module 100a. As shown in FIG. 2, the laser module 100a differs from the laser module 100 in a point that the optical waveguide layers 3, 4 and 12 are oblique to the side of the mount carrier 30. The same components have the same reference numerals in order to avoid a duplicated explanation.

In the second embodiment, the shape and the space of the areas 51 through 54 are different from those of the first embodiment. In the embodiment, the temperature sensor 35 is less subjected to the heat from the heater 9. The controller 200 can control the temperature of the optical waveguide layer 4 accurately. And the laser module 100a can emit a laser light at a desirable wavelength.

Third Embodiment

Figure 3:
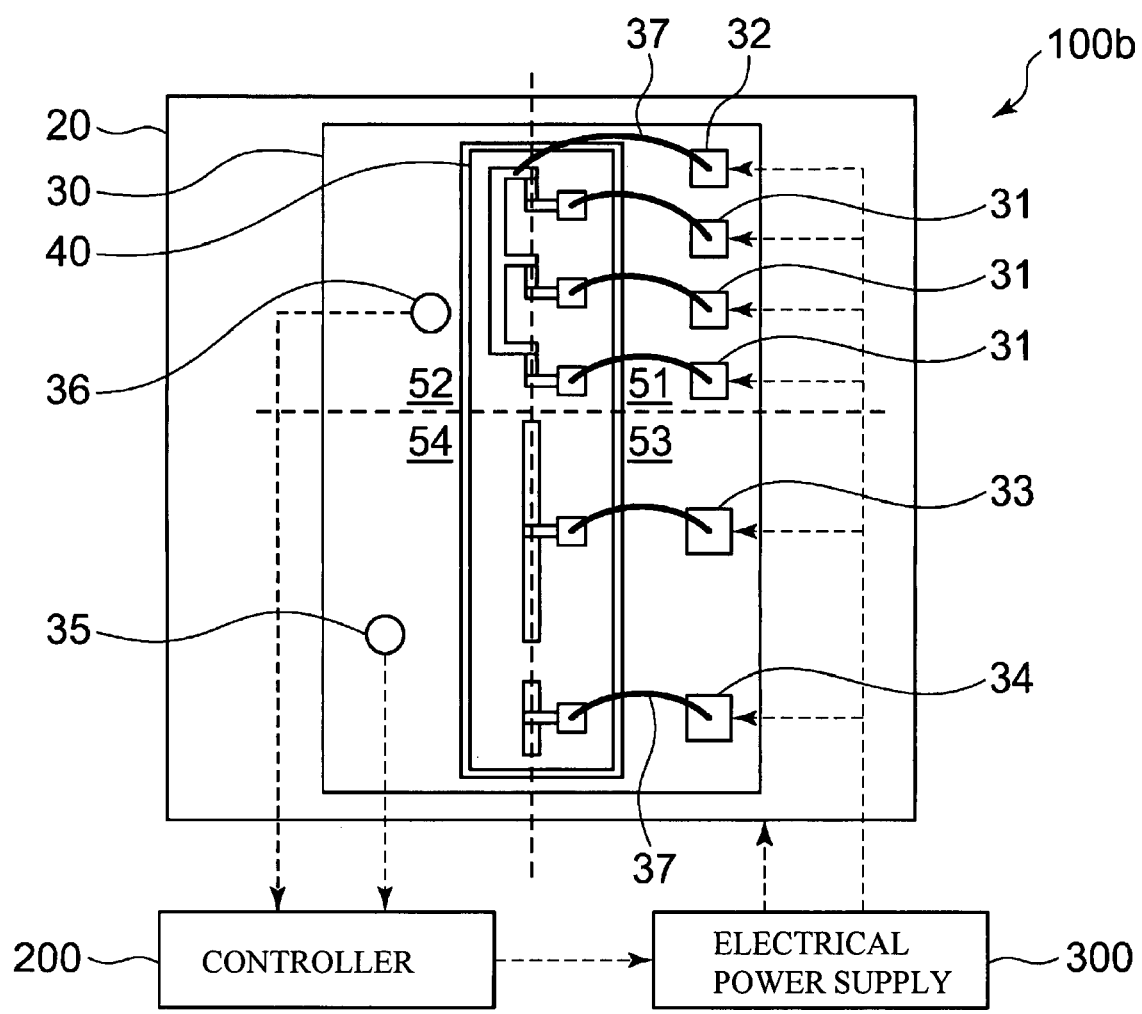
FIG. 3 illustrates an overall structure of a laser module in accordance with a third embodiment.

Next, a description will be given of a laser module 100b in accordance with a third embodiment of the present invention. FIG. 3 illustrates an overall structure of the laser module 100b. As shown in FIG. 3, the laser module 100b differs from the laser module 100 shown in FIG. 1A and FIG. 1B in a point that the metal pattern 32 is arranged on the area 51. The metal pattern 32 is not coupled to the substrate 1 of the wavelength-tunable semiconductor laser chip 40. The ground electrode 11 of the heater 9 may not be coupled to the substrate 1 of the wavelength-tunable semiconductor laser chip 40. In this case, the substrate 1 of the wavelength-tunable semiconductor laser chip 40 acts as a ground electrode of the pathway of the current flowing in the SG-DFB region β and the pathway of the current flowing in the PC region γ. The same components have the same reference numerals in order to avoid a duplicated explanation.

In the embodiment, the area 52 is not coupled to the heater 9 through the wire 37. In this case, the area 52 is less subjected to the heat generated in the heater 9. And the heat generated in the heater 9 mainly affects the area 51. A distance between the temperature sensor 35 and an area that is subjected to the heat from the heater 9 is large, because the area 51 and the area 54 are arranged diagonally to each other. The temperature sensor 35 is less subjected to the heat from the heater 9. And the controller 200 can control the temperature of the optical waveguide layer 4 of the SG-DFB region β accurately. Therefore, the laser module 100b can emit a laser light at a desirable wavelength.

Fourth Embodiment

Figure 4:
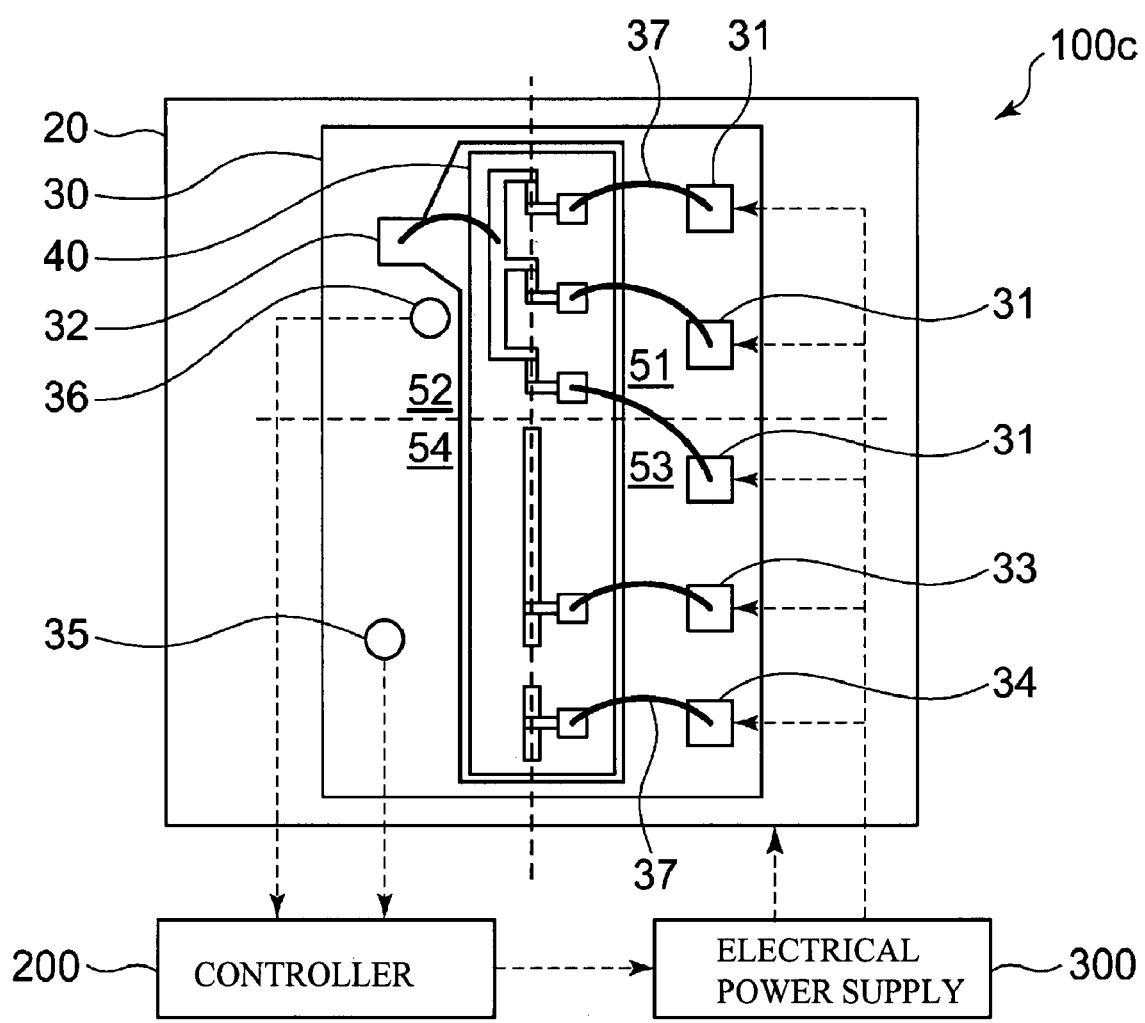
FIG. 4 illustrates an overall structure of a laser module in accordance with a fourth embodiment.

Next, a description will be given of a laser module 100c in accordance with a fourth embodiment. FIG. 4 illustrates an overall structure of the laser module 100c. As shown in FIG. 4, the laser module 100c differs from the laser module 100 shown in FIG. 1A and FIG. 1B in a point that one of the metal patterns 31 is provided on the area 53. The same components have the same reference numerals in order to avoid a duplicated explanation.

In the fourth embodiment, one of the metal patterns 31 is arranged on an area at the optical waveguide layer 4 side where the temperature sensor 35 is not provided. The temperature sensor 35 is less subjected to the heat from the heater 9. And the controller 200 can control the temperature of the optical waveguide layer 4 in the SG-DFB region β accurately. Accordingly, the laser module 100c can emit a laser light at a desirable wavelength.

Fifth Embodiment

Figure 5:
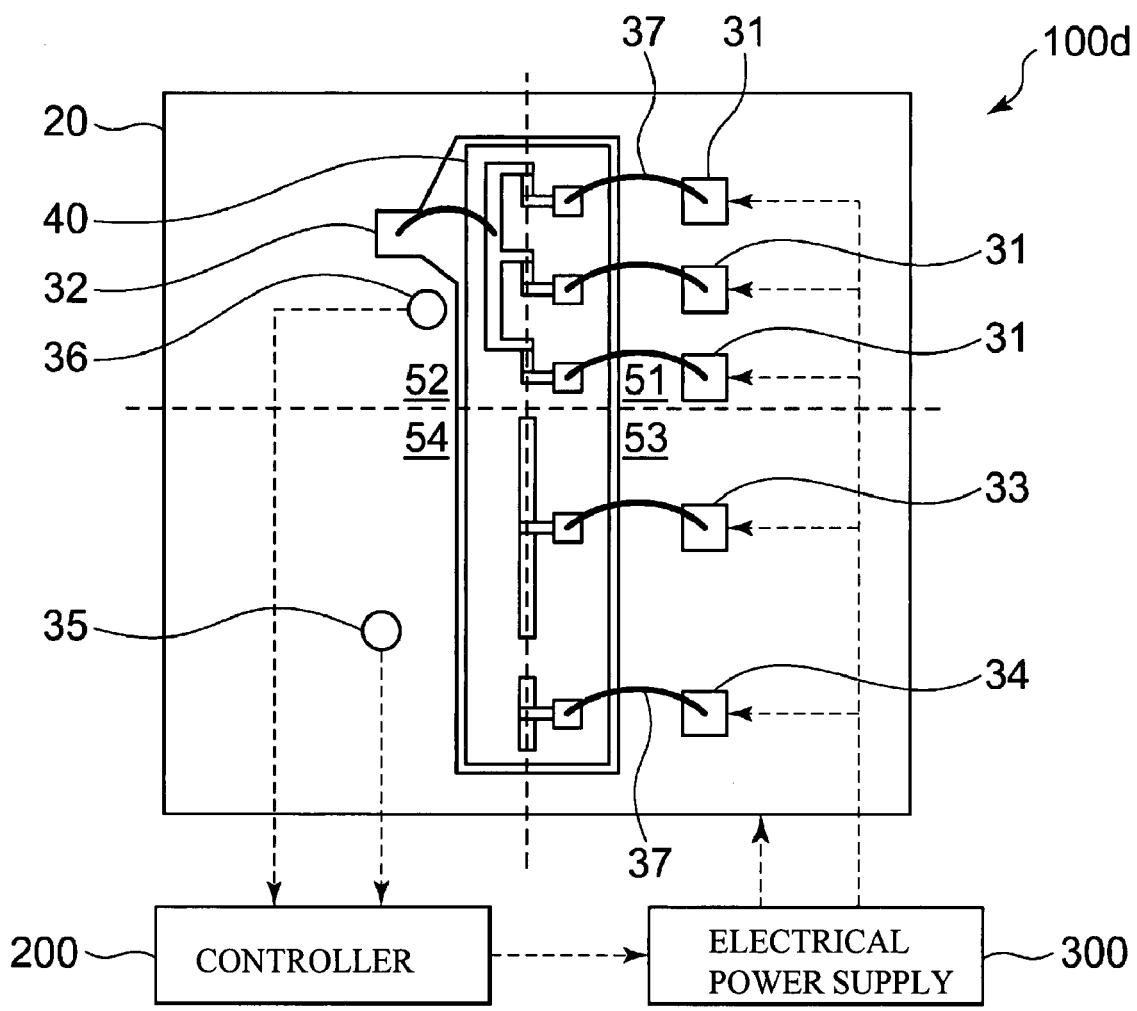
FIG. 5 illustrates an overall structure of a laser module in accordance with a fifth embodiment.

Next, a description will be given of a laser module 100d in accordance with a fifth embodiment of the present invention. FIG. 5 illustrates an overall structure of the laser module 100d. As shown in FIG. 5, the laser module 100d differs from the laser module 100 shown in FIG. 1A and FIG. 1B in a point that the mount carrier 30 is not provided. In the embodiment, the wavelength-tunable semiconductor laser chip 40, the metal patterns 31 through 34 and the temperature sensor 35 are directly mounted on the temperature control device 20, not through the mount carrier 30. The same components have the same reference numerals in order to avoid a duplicated explanation.

In the embodiment, the upper surface of the temperature control device 20 is supposed to be divided into four areas with two lines. One of the two lines is a centerline of the optical waveguide layer 3 in a length direction of the optical waveguide layer 3. The other is at right angles to the centerline and passes an end of the optical waveguide layer 3 at the optical waveguide layer 4 side. Two of the four areas at the optical waveguide layer 3 side are referred to as an area 51 and an area 52. An area at the optical waveguide layer 4 side and adjacent to the area 51d is referred to as an area 53. An area at the optical waveguide layer 4 side and adjacent to the area 52d is referred to as an area 54. In this case, the temperature sensor 35 is less subjected to the heat from the heater 9, as is the case of the first embodiment.

It is possible to emit a laser light at a desirable wavelength, when the metal patterns 31 through 34 are optimally arranged on the temperature control device 20. The laser modules 100a through 100c may have a structure in which the wavelength-tunable semiconductor laser chip 40, the metal patterns 31 through 34 and the temperature sensor 35 are arranged directly on the temperature control device 20 not through the mount carrier 30. The wavelength-tunable semiconductor laser chip 40 and the temperature sensor 35 may be arranged on the mount carrier 30 or on the temperature control device 20 through other component such as a heat sink or a submount carrier, although the wavelength-tunable semiconductor laser chip 40 and the temperature sensor 35 are arranged directly on the mount carrier 30 or the temperature control device 20 in the above embodiments.

In the above embodiments, a laser chip having a SG-DR region and a SG-DFB region is mentioned as an optical semiconductor device in accordance with the present invention. However, the optical semiconductor device is not limited to the laser chip, if having a first optical waveguide, a second optical waveguide and a heater provided on the surface of the second optical waveguide.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-097707 filed on Mar. 31, 2006, the entire disclosure of which is hereby incorporated by reference.

What is claimed is:

1. An optical semiconductor device comprising:
a wavelength-tunable semiconductor laser chip that has a first optical waveguide and a second optical waveguide, the second optical waveguide having a heater on a surface thereof and being optically coupled to the first optical waveguide;
a mount carrier for mounting the wavelength-tunable semiconductor laser chip, the mount carrier having a first area arranged at a surface of the mount carrier of the first optical waveguide side when the wavelength-tunable semiconductor laser chip is mounted;
a first temperature sensor mounted on the first area; and
a wire that couples between the heater and a second area arranged at a surface of the mount carrier of the second optical waveguide side when the wavelength-tunable semiconductor laser chip is mounted.

2. The optical semiconductor device as claimed in claim 1, wherein the wire is coupled to a metal pattern provided on the mount carrier except for the first area.

3. The optical semiconductor device as claimed in claim 2, wherein more than three of the wires and more than three of the metal patterns are provided.

4. The optical semiconductor device as claimed in claim 1, wherein the wire extends to an area,
the area being on the mount carrier, being arranged diagonally to the first area and being at the second optical waveguide side.

5. The optical semiconductor device as claimed in claim 1 further comprising a second temperature sensor mounted on a second area of the mount carrier,
the second area being arranged at a surface of the mount carrier of the second optical waveguide side when the wavelength-tunable semiconductor laser chip is mounted.

6. The optical semiconductor device as claimed in claim 1, wherein the mount carrier is arranged on a temperature control device.

7. The optical semiconductor device as claimed in claim 1, wherein the mount carrier is a surface of a temperature control device.

8. A controlling method of an optical semiconductor device comprising controlling a lasing wavelength of a wavelength-tunable semiconductor laser chip, by controlling a temperature of a temperature control device according to a detection result of a first temperature sensor,
the optical semiconductor device having the wavelength-tunable semiconductor laser chip, a mount carrier for mounting the wavelength-tunable semiconductor laser chip, the first temperature sensor and a wire,
the wavelength-tunable semiconductor laser chip having a first optical waveguide and a second optical waveguide,
the second optical waveguide having the heater on a surface thereof and being optically coupled to the first optical waveguide,
the mount carrier having a first area arranged at a surface of the mount carrier of the first optical waveguide side when the wavelength-tunable semiconductor laser chip is mounted,
the mount carrier being mounted on the temperature control device,
the first temperature sensor being mounted on the first area,
the wire coupling between the heater and a second area arranged at a surface of the mount carrier of the first optical waveguide side when the wavelength-tunable semiconductor laser chip is mounted.

* * * * *